US012701938B2

(12) United States Patent
Liu et al.

(10) Patent No.: US 12,701,938 B2
(45) Date of Patent: Aug. 4, 2026

(54) RADICAL PLASMA TREATMENT FOR SEMICONDUCTOR METAL GATE STACK

(71) Applicant: Applied Materials, Inc., Santa Clara, CA (US)

(72) Inventors: Zhihui Liu, Sunnyvale, CA (US); Seshadri Ganguli, Sunnyvale, CA (US); Tianyi Huang, Santa Clara, CA (US); Yixiong Yang, Fremont, CA (US); Srinivas Gandikota, Santa Clara, CA (US); Yuanhua Zheng, Burlingame, CA (US); Yongjing Lin, San Jose, CA (US); Keyur Karandikar, San Jose, CA (US); Elizabeth Mao, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 500 days.

(21) Appl. No.: 17/941,557

(22) Filed: Sep. 9, 2022

(65) Prior Publication Data

US 2024/0087899 A1    Mar. 14, 2024

(51) Int. Cl.
H01L 21/225 (2006.01)
H01L 21/02 (2006.01)
(Continued)

(52) U.S. Cl.
CPC ............. H10P 32/14 (2026.01); H10D 64/01 (2025.01); H10P 14/6532 (2026.01);
(Continued)

(58) Field of Classification Search
CPC ............. H01L 21/225; H01L 21/02178; H01L 21/02181; H01L 21/02186;
(Continued)

(56) References Cited

U.S. PATENT DOCUMENTS

| 7,696,063 B2 | 4/2010 | Tsuchiya |
| 9,153,495 B2 | 10/2015 | Aoki et al. |

(Continued)

FOREIGN PATENT DOCUMENTS

| KR | 20200059283 A | 5/2020 |
| TW | 202115777 A | 4/2021 |

OTHER PUBLICATIONS

U.S. Appl. No. 17/541,582, filed Dec. 3, 2021, 36 pages.
(Continued)

*Primary Examiner* — Norman D Richards
*Assistant Examiner* — Ethan Edward Cutler
(74) *Attorney, Agent, or Firm* — SERVILLA WHITNEY LLC

(57) ABSTRACT

Methods of manufacturing and processing semiconductor devices (i.e., electronic devices) are described. The methods include treating a surface of a metal gate stack with a radical treatment. The radical treatment may be used to treat one or more layers or surfaces of layers in the metal gate stack. The radical treatment may be performed once or multiple times during the methods described herein. The radical treatment comprises flowing one or more of nitrogen radicals ($N_2$*) and hydrogen radicals (H*) over the surface of the metal gate stack.

20 Claims, 4 Drawing Sheets

(51) Int. Cl.
    *H10D 64/01*         (2025.01)
    *H10P 14/60*         (2026.01)
    *H10P 14/692*        (2026.01)
    *H10P 32/14*         (2026.01)

(52) U.S. Cl.
    CPC .. *H10P 14/69391* (2026.01); *H10P 14/69392* (2026.01); *H10P 14/69394* (2026.01); *H10P 14/69395* (2026.01); *H10P 14/69396* (2026.01); *H10P 14/69397* (2026.01)

(58) Field of Classification Search
    CPC ......... H01L 21/02189; H01L 21/02192; H01L 21/02194; H01L 21/0234; H01L 29/401
    See application file for complete search history.

(56)              References Cited

U.S. PATENT DOCUMENTS

| | | | |
|---|---|---|---|
| 10,304,835 B1 * | 5/2019 | Tsai ................... | H01L 21/02318 |
| 2005/0127417 A1 * | 6/2005 | Saenger ............ | H01L 21/31122 |
| | | | 257/295 |
| 2006/0040483 A1 * | 2/2006 | Niimi ................... | H10D 64/691 |
| | | | 257/E21.247 |
| 2008/0124919 A1 * | 5/2008 | Huang ............. | H01L 21/02063 |
| | | | 438/643 |
| 2010/0171187 A1 | 7/2010 | Andreoni et al. | |
| 2015/0262887 A1 | 9/2015 | Xu et al. | |
| 2016/0211183 A1 | 7/2016 | Ji et al. | |
| 2017/0022612 A1 * | 1/2017 | Lei ........................ | C23C 16/342 |
| 2017/0032975 A1 | 2/2017 | Tai et al. | |
| 2020/0373404 A1 * | 11/2020 | Lin ..................... | H10D 64/685 |
| 2021/0134597 A1 | 5/2021 | Ji | |

OTHER PUBLICATIONS

U.S. Appl. No. 63/285,595, filed Dec. 3, 2021, 32 pages.
PCT International Search Report and Written Opinion in PCT/US2023/032024 dated Dec. 27, 2023, 9 pages.

* cited by examiner

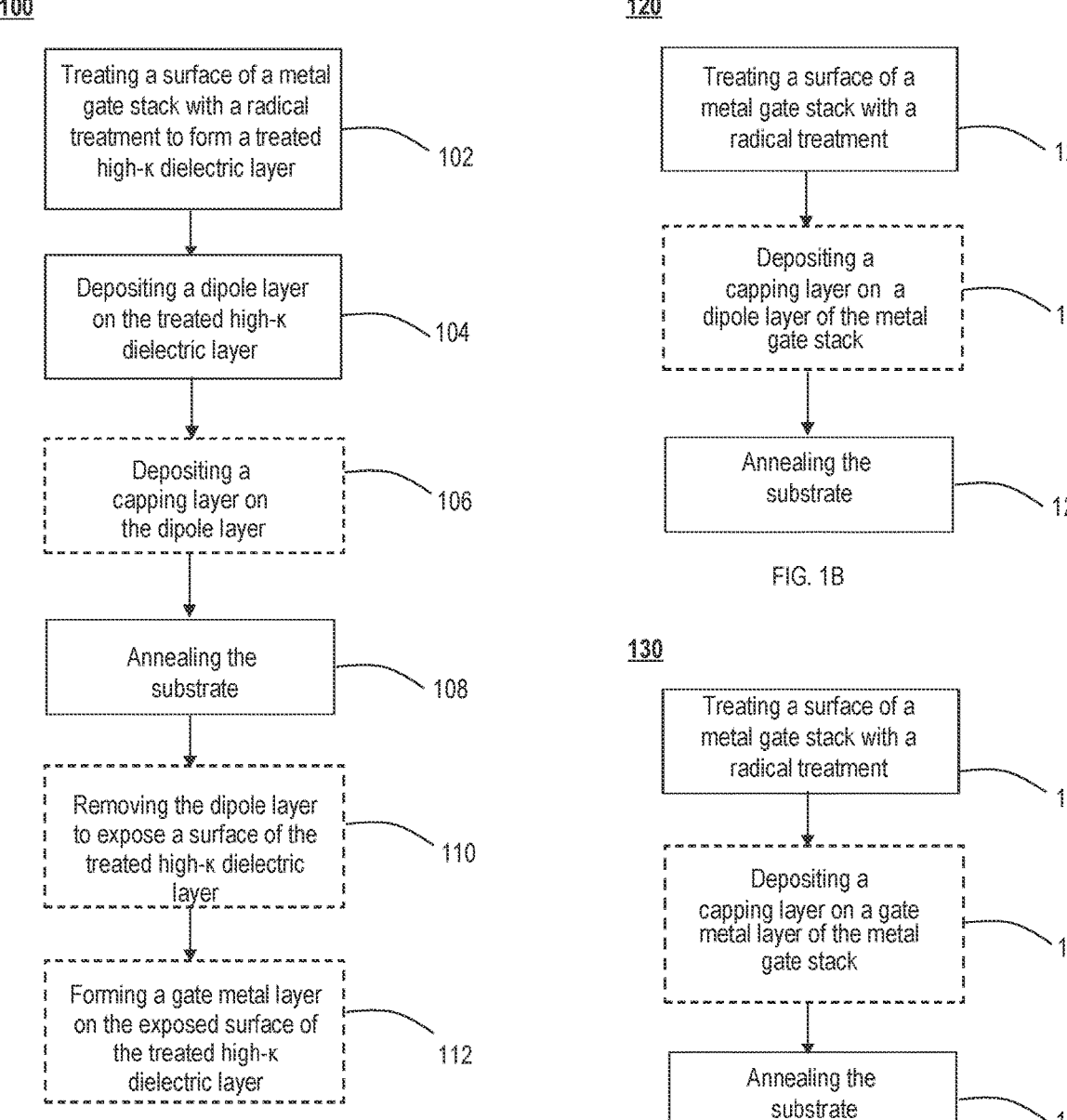

100

Treating a surface of a metal gate stack with a radical treatment to form a treated high-κ dielectric layer — 102

Depositing a dipole layer on the treated high-κ dielectric layer — 104

Depositing a capping layer on the dipole layer — 106

Annealing the substrate — 108

Removing the dipole layer to expose a surface of the treated high-κ dielectric layer — 110

Forming a gate metal layer on the exposed surface of the treated high-κ dielectric layer — 112

Treating a surface of a metal gate stack with a radical treatment — 122

Depositing a capping layer on a dipole layer of the metal gate stack — 124

Annealing the substrate — 126

Treating a surface of a metal gate stack with a radical treatment — 132

Depositing a capping layer on a gate metal layer of the metal gate stack — 134

Annealing the substrate — 136

RADICAL PLASMA TREATMENT FOR SEMICONDUCTOR METAL GATE STACK

TECHNICAL FIELD

Embodiments of the present disclosure pertain to the field of electronic device manufacturing and, in particular, to transistors. More particularly, embodiments of the disclosure are directed to methods of manufacturing transistors that include a radical treatment.

BACKGROUND

Integrated circuits have evolved into complex devices that can include millions of transistors, capacitors, and resistors on a single chip. In the course of integrated circuit evolution, functional density (i.e., the number of interconnected devices per chip area) has generally increased while geometry size (i.e., the smallest component (or line) that can be created using a fabrication process) has decreased.

Transistors are circuit components or elements that are often formed on semiconductor devices. Many transistors may be formed on a semiconductor device in addition to capacitors, inductors, resistors, diodes, conductive lines, or other elements, depending on the circuit design. Integrated circuits incorporate planar field-effect transistors (FETs) in which current flows through a semiconducting channel between a source and a drain, in response to a voltage applied to a control gate.

As device dimensions have shrunk, device geometries and materials have experienced difficulty maintaining switching speeds without incurring failures. Several new technologies emerged that allowed chip designers to continue shrinking gate lengths. Control of the dimensions of device structure is a key challenge for present and future technology generations.

Shrinking of the materials currently used as N- and P-MOS have become a challenge due to change in basic properties, such as threshold voltage ($V_t$). Additionally, the migration of transistor technology from planar to FinFET and GAA requires conformal work function layers for multiple threshold voltages. The $V_t$ tuning range will be limited by the film thickness variation with further scaling down of device sizes. Current methods of tuning the $V_t$ in N- and P-MOS device structures include depositing a dipole film and thermally driving atoms of the dipole film into the interface of a high-κ dielectric layer on an interfacial layer. In these methods, the dipole film composition is limited by available chemistry and deposition temperature constraints.

Accordingly, there is a need for methods of manufacturing electronic devices that meet reduced thickness, lower thermal budget, and $V_t$ requirements and improve device performance and reliability.

SUMMARY

One or more embodiments are directed to a method of manufacturing an electronic device. In some embodiments, the method includes treating a surface of a metal gate stack with a radical treatment. In some embodiments, the metal gate stack comprises a high-κ dielectric layer on an interfacial layer on a top surface of a channel located between a source and a drain on a substrate. The radical treatment comprises flowing one or more of nitrogen radicals ($N_2^*$) and hydrogen radicals ($H^*$) over the surface of the metal gate stack to form a treated high-κ dielectric layer. The method further comprises depositing a dipole layer on the treated high-κ dielectric layer and annealing the substrate at a temperature of less than or equal to 1050° C. to drive atoms from the dipole layer into the high-κ dielectric layer. The method optionally includes depositing a capping layer on the dipole layer.

Additional embodiments are directed to a method of manufacturing an electronic device. In some embodiments, the method includes treating a surface of a metal gate stack with a radical treatment. In some embodiments, the metal gate stack comprises a dipole layer on a high-κ dielectric layer on an interfacial layer on a top surface of a channel located between a source and a drain on a substrate. The radical treatment comprises flowing one or more of nitrogen radicals ($N_2^*$) and hydrogen radicals ($H^*$) over the surface of the metal gate stack. The method further comprises annealing the substrate at a temperature of less than or equal to 1050° C. to drive atoms from the dipole layer into the high-κ dielectric layer. The method optionally includes depositing a capping layer on the dipole layer.

Further embodiments are directed to a method of manufacturing an electronic device. The method comprises treating a surface of a metal gate stack with a radical treatment. In some embodiments, the metal gate stack comprises a gate metal layer on a high-κ dielectric layer on an interfacial layer on a top surface of a channel located between a source and a drain on a substrate. The radical treatment comprises flowing one or more of nitrogen radicals ($N_2^*$) and hydrogen radicals ($H^*$) over the surface of the metal gate stack.

BRIEF DESCRIPTION OF THE DRAWINGS

So that the manner in which the above recited features can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope.

FIG. 1A depicts a process flow diagram of a method according to one or more embodiments;

FIG. 1B depicts a process flow diagram of a method according to one or more embodiments;

FIG. 1C depicts a process flow diagram of a method according to one or more embodiments;

DETAILED DESCRIPTION

Figure 2:
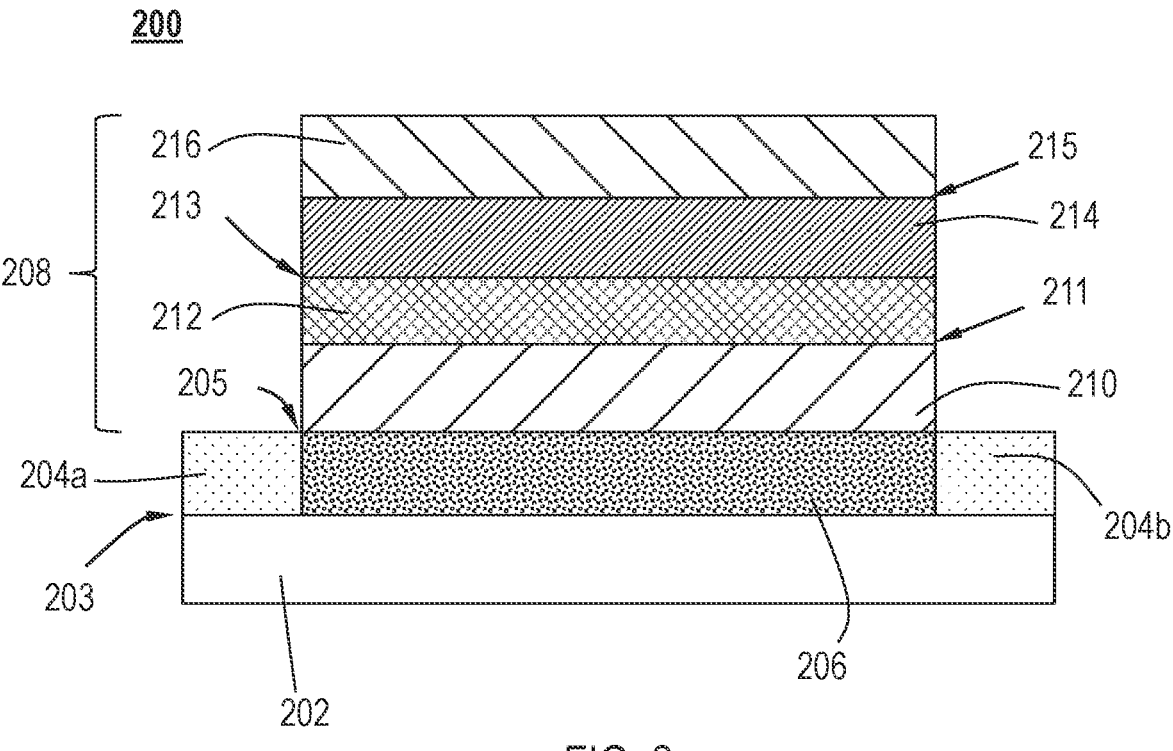
FIG. 2 illustrates a cross-sectional view of a substrate according to one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "about" as used herein means approximately or nearly and in the context of a numerical value or range set forth means a variation of ±15%, or less, of the numerical value. For example, a value differing by ±14%, ±10%, ±5%, ±2%, or ±1%, would satisfy the definition of about.

As used in this specification and the appended claims, the term "substrate" or "wafer" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

The term "on" indicates that there is direct contact between elements. The term "directly on" indicates that there is direct contact between elements with no intervening elements.

As used in this specification and the appended claims, the terms "layer" and "film" may be used interchangeably unless otherwise indicated.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

Transistors are circuit components or elements that are often formed on semiconductor devices. Depending upon the circuit design, in addition to capacitors, inductors, resistors, diodes, conductive lines, or other elements, transistors are formed on a semiconductor device. Generally, a transistor includes a gate formed between source and drain regions. In one or more embodiments, the source and drain regions include a doped region of a substrate and exhibit a doping profile suitable for a particular application. The gate is positioned over the channel region and includes a gate dielectric interposed between a gate electrode and the channel region in the substrate.

As used herein, the term "field effect transistor" or "FET" refers to a transistor that uses an electric field to control the electrical behavior of the device. Field effect transistors are voltage controlled devices where its current carrying ability is changed by applying an electric field. Field effect transistors generally display very high input impedance at low temperatures. The conductivity between the drain and source terminals is controlled by an electric field in the device, which is generated by a voltage difference between the body and the gate of the device. The FET's three terminals are source (S), through which the carriers enter the channel; drain (D), through which the carriers leave the channel; and gate (G), the terminal that modulates the channel conductivity. Conventionally, current entering the channel at the source (S) is designated $I_S$ and current entering the channel at the drain (D) is designated $I_D$. Drain-to-source voltage is designated $V_{DS}$. By applying voltage to gate (G), the current entering the channel at the drain (i.e., $I_D$) can be controlled.

The metal-oxide-semiconductor field-effect transistor (MOSFET) is a type of field-effect transistor (FET) and is used in integrated circuits and high speed switching applications. MOSFET has an insulated gate, whose voltage determines the conductivity of the device. This ability to change conductivity with the amount of applied voltage is used for amplifying or switching electronic signals. A MOSFET is based on the modulation of charge concentration by a metal-oxide-semiconductor (MOS) capacitance between a body electrode and a gate electrode located above the body and insulated from all other device regions by a gate dielectric layer. Compared to the MOS capacitor, the MOS-FET includes two additional terminals (source and drain), each connected to individual highly doped regions that are separated by the body region. These regions can be either p or n type, but they are both be of the same type, and of opposite type to the body region. The source and drain (unlike the body) are highly doped as signified by a "+" sign after the type of doping.

If the MOSFET is an n-channel or nMOS FET, then the source and drain are n+ regions and the body is a p-type substrate region. If the MOSFET is a p-channel or pMOS FET, then the source and drain are p+ regions and the body is a n-type substrate region. The source is so named because it is the source of the charge carriers (electrons for n-channel, holes for p-channel) that flow through the channel; similarly, the drain is where the charge carriers leave the channel.

A nMOS FET is made up of a n-type source and drain and a p-type substrate. When a voltage is applied to the gate, holes in the body (p-type substrate) are driven away from the gate. This allows forming an n-type channel between the source and the drain and a current is carried by electrons from source to the drain through an induced n-type channel. Logic gates and other digital devices implemented using NMOSs are said to have NMOS logic. There are three modes of operation in a NMOS called the cut-off, triode and saturation. Circuits with NMOS logic gates dissipate static power when the circuit is idling, since DC current flows through the logic gate when the output is low.

A pMOS FET is made up of p-type source and drain and a n-type substrate. When a positive voltage is applied between the source and the gate (negative voltage between gate and source), a p-type channel is formed between the source and the drain with opposite polarities. A current is carried by holes from source to the drain through an induced p-type channel. A high voltage on the gate will cause a PMOS not to conduct, while a low voltage on the gate will cause it to conduct. Logic gates and other digital devices implemented using PMOS are said have PMOS logic. PMOS technology is low cost and has a good noise immunity.

In a NMOS, carriers are electrons, while in a PMOS, carriers are holes. When a high voltage is applied to the gate, NMOS will conduct, while PMOS will not. Furthermore, when a low voltage is applied in the gate, NMOS will not conduct and PMOS will conduct. NMOS are considered to be faster than PMOS, since the carriers in NMOS, which are electrons, travel twice as fast as holes, which are the carriers in PMOS. But PMOS devices are more immune to noise than NMOS devices. Furthermore, NMOS ICs would be smaller than PMOS ICs (that give the same functionality), since the NMOS can provide one-half of the impedance provided by a PMOS (which has the same geometry and operating conditions).

As used herein, the term "fin field-effect transistor (Fin-FET)" refers to a MOSFET transistor built on a substrate where the gate is placed on two, three, or four sides of the channel or wrapped around the channel, forming a double gate structure. FinFET devices have been given the generic name FinFETs because the source/drain region forms "fins" on the substrate. FinFET devices have fast switching times and high current density.

As used herein, the term "gate all-around (GAA)," is used to refer to an electronic device, e.g., a transistor, in which the gate material surrounds the channel region on all sides. The channel region of a GAA transistor may include nano-wires or nano-slabs or nano-sheets, bar-shaped channels, or other suitable channel configurations known to one of skill in the art. In one or more embodiments, the channel region of a GAA device has multiple horizontal nanowires or horizontal bars vertically spaced, making the GAA transistor a stacked horizontal gate-all-around (hGAA) transistor.

As used herein, the term "nanowire" refers to a nano-structure, with a diameter on the order of a nanometer ($10^{-9}$ meters). Alternatively, nanowires can be defined as structures having a thickness or diameter constrained to tens of nanometers or less and an unconstrained length. Nanowires are used in transistors and some laser applications, and, in one or more embodiments, are made of semiconducting materials, metallic materials, insulating materials, superconducting materials, or molecular materials. In one or more embodiments, nanowires are used in transistors for logic CPU, GPU, MPU, and volatile (e.g., DRAM) and non-volatile (e.g., NAND) devices. As used herein, the term "nanosheet" refers to a two-dimensional nanostructure with a thickness in a scale ranging from about 0.1 nm to about 1000 nm, or from 0.5 nm to 500 nm, or from 0.5 nm to 100 nm, or from 1 nm to 500 nm, or from 1 nm to 100 nm, or from 1 nm to 50 nm.

Embodiments of the present disclosure advantageously provide electronic devices which meet reduced thickness, lower thermal budget, and $V_t$ requirements and have improved device performance and reliability. Embodiments of the present disclosure advantageously provide methods of manufacturing electronic devices which are not limited by available chemistry and deposition temperature constraints.

One or more embodiments are advantageously directed to a radical treatment that provides the ability to modify film properties or film surfaces to achieve the required Vt and/or improve device performance and reliability. The radical treatment may be performed multiple times during the disclosed methods of manufacturing electronic devices. Without intending to be bound by theory, it is thought that the radical treatment can be performed during the manufacture of planar field-effect transistors (FETs), fin field-effect transistor (FinFETs), and/or gate-all-around (GAA) transistors.

In one or more embodiments, it has been advantageously found that treating the film in a metal gate stack (e.g., a dipole film, a p-metal film and/or an n-metal film) with the radical treatment described herein improves film properties.

Further embodiments of the disclosure include treating an interfacial layer and/or a high-κ dielectric layer in a metal gate stack which advantageously improves $V_t$ and does not impact equivalent oxide thickness (EOT). Embodiments of the disclosure improve $V_t$ significantly without EOT penalty due to a new integration scheme. Stated differently, improving $V_t$ results in a decrease of EOT. Embodiments of the disclosure include dipole materials that provide at least 50 mV $V_t$ shift with minimum EOT increase. As used herein, "minimum EOT increase" means that the total EOT increases by a value of less than or equal to 5%, including less than or equal to 4%, less than or equal to 3%, less than or equal to 2%, less than or equal to 1%, less than or equal to 0.5%, or less than or equal to 0.1%.

In one or more embodiments, it has been advantageously found that treating a surface, such as a surface of a high-κ dielectric layer, with the radical treatment described herein provides a better surface for nucleation and growth of a film on the treated surface.

Further embodiments of the disclosure include depositing a capping layer on a dipole layer or on a gate metal layer in a metal gate stack and treating the capping layer on the dipole layer or on the gate metal layer. In one or more embodiments, it has been advantageously found that treating the capping layer with the radical treatment described herein improves the hermitic sealing strength between the capping layer and the dipole layer or the gate metal layer. In one or more embodiments, it has been additionally found that treating the capping layer with the radical treatment described herein advantageously controls oxidation of the dipole layer or the gate metal layer. Stated differently, in some embodiments, treating the capping layer with the radical treatment described herein does not modify the composition of the dipole layer or the metal gate layer.

The radical treatment comprises flowing one or more of nitrogen radicals (N$_2$*) and hydrogen radicals (H*) over a surface of the metal gate stack. In some embodiments, the radical treatment comprises flowing nitrogen radicals (N$_2$*) over the surface of the metal gate stack. In other embodiments, the radical treatment comprises flowing hydrogen radicals (H*) over the surface of the metal gate stack.

In some embodiments, the radical treatment comprises flowing a mixture of nitrogen radicals (N$_2$*) and hydrogen radicals (H*) over the surface of the metal gate stack. The composition of the mixture of nitrogen radicals (N$_2$*) and hydrogen radicals (H*) may include any suitable ratio of nitrogen radicals (N$_2$*) to hydrogen radicals (H*) and the ratio may be optimized or modified based on the specific application. In one or more embodiments, the composition of the mixture of nitrogen radicals (N$_2$*) and hydrogen radicals (H*) includes about 50% nitrogen radicals (N$_2$*) and about 50% hydrogen radicals (H*).

The nitrogen radicals (N$_2$*) and/or hydrogen radicals (H*) may be generated by any suitable plasma source known to the skilled artisan. Suitable plasma sources include, but are not limited to, capacitively coupled plasma (CCP) sources, inductively coupled plasma (ICP) sources, or microwave plasma sources. In some embodiments, for example, the nitrogen radicals (N$_2$*) and/or hydrogen radicals (H*) are generated by an inductively coupled plasma (ICP) source maintained at a pressure in a range of from 100 mTorr to 1500 mTorr, including in a range of from 100 mTorr to 1000 mTorr, in a range of from 100 mTorr to 700 mTorr, in a range of from 200 mTorr to 1400 mTorr, in a range of from 300 mTorr to 1300 mTorr, in a range of from 400 mTorr to 1200 mTorr, in a range of from 500 mTorr to 1100 mTorr, in a range of from 600 mTorr to 1000 mTorr, or in a range of from 700 mTorr to 900 mTorr.

The nitrogen radicals (N$_2$*) and/or hydrogen radicals (H*) may be flowed at any suitable flow rate known to the skilled artisan. In some embodiments, the flow rate may be modified or optimized depending on the specific application. As an example, the flow rate may be modified for optimized depending on the size of the wafer or substrate. For example, in one or more embodiments where the radical treatment comprises flowing a mixture of nitrogen radicals (N$_2$*) and hydrogen radicals (H*) generated by an inductively coupled plasma (ICP) source maintained at a pressure in a range of from 100 mTorr to 1500 mTorr, the total flow rate of a mixture of the nitrogen radicals (N$_2$*) and hydrogen radicals (H*) is in a range of from 500 sccm to 2000 sccm.

The embodiments of the disclosure are described by way of the Figures, which illustrate devices (e.g., transistors) and processes for forming planar field-effect transistors (FETs), fin field-effect transistor (FinFETs), and/or gate-all-around (GAA) transistors in accordance with one or more embodiments of the disclosure. The processes shown are merely illustrative possible uses for the disclosed processes, and the skilled artisan will recognize that the disclosed processes are not limited to the illustrated applications.

FIGS. 1A-1C depict process flow diagrams of methods of manufacturing an electronic device in accordance with one or more embodiments of the present disclosure. FIG. 1A illustrates a process flow diagram of method 100. FIG. 1B illustrates a process flow diagram of method 120. FIG. 1C illustrates a process flow diagram of method 130. One or more operations shown in FIGS. 1A-1C may be performed in one or more of methods 100, 120, 130. Stated differently, the operation of "annealing the substrate," for example, may be performed in each method 100, 120, 130.

Referring to FIG. 1A, the method 100 begins at operation 102 by treating a surface of a metal gate stack with a radical treatment to form a treated high-κ dielectric layer. At operation 104, the method 100 comprises depositing a dipole layer on the treated high-κ dielectric layer. At operation 106, the method optionally includes depositing a capping layer on the dipole layer. At operation 108, the method 100 includes annealing the substrate. At operation 110, the method 100 optionally includes removing the dipole layer to expose a surface of the treated high-κ dielectric layer. At operation 112, the method 100 optionally includes forming a gate metal layer on the exposed surface of the treated high-κ dielectric layer. The radical treatment may be performed multiple times during method 100.

Referring to each of FIGS. 1A-1C, the metal gate stack comprises a high-κ dielectric layer on an interfacial layer on a top surface of a channel located between a source and a drain on a substrate.

The interfacial layer is deposited using a deposition technique, such as, but not limited to, ALD, CVD, PVD, MBE, MOCVD, spin-on, or other insulating layer deposition techniques known to the skilled artisan. In one or more embodiments, the interfacial layer may be formed by etching and an oxide forming on the surface.

In some embodiments, a wet chemistry technique is performed to form the interfacial layer. The wet chemistry technique may be any technique known to the skilled artisan. In some embodiments, the wet chemistry technique includes a pre-clean process. In some embodiments, the pre-clean process includes using dilute hydrofluoric acid (dilute HF), including greater than 100:1, such as 130:1 dilute HF, to etch away native oxide on the substrate to form a hydrophobic surface. In some embodiments, after using dilute HF to form the hydrophobic surface, the pre-clean process includes using a SC-1 solution comprising one or more of ozone, ammonium hydroxide or hydrogen peroxide. In some embodiments, the pre-clean process includes using a SC-1 solution without ozone, ammonium hydroxide or hydrogen peroxide. In some embodiments, the SC-1 solution is used to form the interfacial layer. Without intending to be bound by theory, it is thought that using the pre-clean process described herein enables controlled deposition of the interfacial layer.

In some embodiments, the high-κ dielectric layer is deposited using a deposition technique, such as, but not limited to, ALD, CVD, PVD, MBE, MOCVD, spin-on, or other insulating layer deposition techniques known to the skilled artisan. In some embodiments, the high-κ dielectric layer is conformally deposited by ALD.

In one or more embodiments, it has also been found that the radical treatment advantageously reduces equivalent oxide thickness (EOT) in the electronic device compared to methods of manufacturing an electronic device that do not include a radical treatment. For example, by performing the radical treatment, the thickness of the interfacial layer beneath the high-κ dielectric layer is reduced, which would reduce equivalent oxide thickness (EOT)/CET. In some embodiments, the thickness of the interfacial layer is reduced by at least 5%, including about 6%, about 7%, about 8%, about 9%, or about 10%, as a result of the radical treatment.

In one or more embodiments, it has also been found that the radical treatment can nitridate the high-κ dielectric layer, which increases the high-κ dielectric constant (decreases EOT) and can improve the device performance and reliability. In some embodiments, the amount of nitrogen ($N_2$) atoms present in the high-κ dielectric layer is increased by at least 50%, including at least 55%, at least 60%, at least 65%, at least 70%, or at least 75% as a result of the radical treatment.

Referring again to FIG. 1A, the method 100 begins at operation 102 by treating a surface of a metal gate stack with a radical treatment to form a treated high-κ dielectric layer. The radical treatment comprises flowing one or more of nitrogen radicals ($N_2$*) and hydrogen radicals (H*) over the surface of the metal gate stack to form the treated high-κ dielectric layer. In some embodiments, the radical treatment comprises flowing a mixture of nitrogen radicals ($N_2$*) and hydrogen radicals (H*) over the surface of the metal gate stack to form the treated high-κ dielectric layer.

At operation 104 of method 100, the dipole layer is deposited on the treated high-κ dielectric layer using a deposition technique, such as, but not limited to, ALD, CVD, PVD, MBE, MOCVD, spin-on, or other insulating layer deposition techniques known to the skilled artisan. In some embodiments, the dipole layer is deposited on the treated high-κ dielectric layer by ALD. According to some embodiments, an ALD cycle comprises exposing a substrate to a metal precursor pulse to form a dipole layer on the surface of the substrate. The metal precursor is then purged from the processing chamber or removed from the reaction region adjacent the substrate surface. The substrate with the dipole layer thereon is exposed to a pulse of nitrogen reactant (e.g., ammonia) to form a metal containing layer or a metal nitride containing layer on the substrate surface. The nitrogen reactant is then purged from the processing chamber or removed from the reaction region adjacent the substrate surface.

In one or more embodiments, it has been advantageously found that the radical treatment reduces nucleation delay and increases continuity of the dipole layer deposited on the treated high-κ dielectric layer compared to methods of manufacturing an electronic device that do not include a radical treatment. Stated differently, reducing nucleation delay means that the deposited layer (e.g., the deposited dipole layer) becomes more continuous with fewer growth cycles performed. It is thought that the radical treatment reduces the thickness of the dipole layer that needs to be deposited on the treated high-κ dielectric layer compared to methods of manufacturing an electronic device that do not include a radical treatment. In one or more embodiments, it has also been found that the radical treatment advantageously increases coverage of the dipole layer deposited on the treated high-κ dielectric layer compared to methods of manufacturing an electronic device that do not include a radical treatment. Stated differently, increasing coverage means that an increased portion of the surface of the treated high-κ dielectric layer is covered with atoms of the dipole layer as a result of the radial treatment.

In some embodiments, the dipole layer comprises one or more of titanium lanthanum nitride (TiLaN), titanium yttrium nitride (TiYN), titanium strontium nitride (TiSrN), titanium magnesium nitride (TiMgN), titanium aluminum nitride (TiAlN), or titanium tantalum nitride (TiTaN).

In some embodiments, the dipole layer comprises one or more of hafnium carbide (HfC), hafnium nitride (HfN), hafnium oxynitride (HfON), hafnium oxycarbide (HIOC), hafnium carbide aluminum (HfCAl), hafnium aluminum nitride (HfAlN), or hafnium carbonitride (HfCN).

In some embodiments, the dipole layer comprises one or more of titanium aluminum nitride (TiAlN), titanium tantalum nitride (TiTaN), titanium oxide (TiO), tantalum oxide (TaO), and titanium aluminum carbide (TiAlC).

In some embodiments, the channel comprises n-type material and the dipole layer comprises an element from the lanthanide series. In some embodiments, the channel comprises n-type material and the dipole layer comprises one or more of lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), magnesium (Mg), scandium (Sc), strontium (Sr), yttrium (Y), zirconium (Zr), barium (Ba), or caesium (Cs).

In some embodiments, the channel comprises n-type material and the dipole layer comprises a nitridated element from the lanthanide series, such as lanthanum nitride (LaN). In one or more embodiments where the dipole layer comprises lanthanum nitride (LaN), for example, the dipole layer is treated with the radical treatment. Without intending to be bound by theory, in embodiments where the dipole layer comprises lanthanum nitride (LaN), it is thought that the radical treatment comprising flowing hydrogen radicals (H*) or flowing a mixture of nitrogen radicals ($N_2$*) and hydrogen radicals (H*) advantageously reduces the amount of carbon atoms in the dipole layer.

In some embodiments, the channel comprises p-type material and the dipole layer comprises one or more of aluminum (Al), titanium (Ti), gallium (Ga), germanium (Ge), selenium (Se), indium (In), tin (Sn), antimony (Sb), tellurium (Te), tantalum (Ta), tungsten (W), or molybdenum (Mo).

In some embodiments, the dipole layer comprises one or more of strontium (Sr), yttrium (Y), ytterbium (Yb), antimony (Sb), or tellurium (Te).

In some embodiments, the nitrogen-containing reactant comprises one or more of nitrogen ($N_2$), ammonia ($NH_3$), hydrazine ($N_2H_4$), or a co-flow of nitrogen radicals ($N_2$*) and hydrogen radicals (H*). In some embodiments the nitrogen-containing reactant comprises a substituted or unsubstituted alkyl hydrazine. In some embodiments, the alkyl hydrazine comprises in a range of from 1 carbon to 6 carbons. In one or more embodiments, the alkyl hydrazine is t-butyl hydrazine. In some embodiments, the nitrogen-containing reactant comprises a plasma.

Without intending to be bound by theory, it is believed that some metal nitrides may be unstable nitrides or metastable nitrides at high deposition temperature/high temperature processing. For example, one or more metal nitrides may be an unstable nitride at temperatures greater than or equal to 250° C. Stated differently, some metal nitrides may not have the same stoichiometry of that of a metal nitride at temperatures greater than or equal to 250° C.

In some embodiments, at operation 104, the dipole layer is deposited on the high-κ dielectric layer by ALD at a temperature of less than or equal to 500° C. and at a pressure of less than or equal to 50 Torr. In some embodiments, the temperature is in a range of from 100° C. to 500° C., or in a range of from 150° C. to 450° C., in a range of from 200° C. to 400° C., or in a range of from 250° C. to 350° C. In some embodiments, the pressure is in a range of from 0 mTorr to 50 Torr, or in the range of from 100 mTorr to 50 Torr, or in the range of from 1 Torr to 40 Torr, in the range of from 10 Torr to about 35 Torr, or in the range of from 20 Torr to 30 Torr. Without intending to be bound by theory, it is believed that, when the dipole layer is deposited on the high-κ dielectric layer by ALD at a temperature of 450° C. or 500° C., for example, atoms from the dipole layer are driven into the high-κ dielectric layer.

In some embodiments, at operation 106, the capping layer is optionally deposited on the dipole layer using a deposition technique, such as, but not limited to, ALD, CVD, PVD, MBE, MOCVD, spin-on, or other insulating layer deposition techniques known to the skilled artisan.

In some embodiments, at operation 108, the method 100 comprises annealing the substrate at a temperature of less than or equal to 1100° C. to drive atoms from the dipole layer into the high-κ dielectric layer. In some embodiments, at operation 108, the method 100 comprises annealing the substrate at a temperature of less than or equal to 1050° C. to drive atoms from the dipole layer into the high-κ dielectric layer. In some embodiments, the temperature is in a range of from 500° C. to 1100° C., including in a range of from 500° C. to 1050° C., including in a range of from 600° C. to 1025° C., in a range of from 700° C. to 1000° C., in a range of from 750° C. to 950° C., or in a range of from 800° C. to 900° C.

Without intending to be bound by theory, it is thought that annealing the substrate according to operation 108 drives an increased number of atoms from the dipole layer into one or more of the interfacial layer or the high-κ dielectric layer, as compared to methods where annealing does not occur. In one or more embodiments, annealing the substrate at operation 108 includes a rapid thermal process (RTP). The RTP may be any suitable process known to the skilled artisan. Without intending to be bound by theory, the RTP is believed to densify and improve the physical properties of the deposited dipole layer.

Without intending to be bound by theory, it is thought that a dipole region comprising a channel having n-type material or p-type material, and a dipole layer as described above, simplifies the existing integration flow, reducing the integration costs. Additionally, when atoms (such as metal atoms) from the dipole layer are embedded in the interfacial layer and/or the high-κ dielectric layer, the dipole region is formed and it is thought that oxidation can be reduced, which would potentially reduce the annealing temperature required.

In one or more embodiments where the capping layer is present, at operation 110, the method 100 comprises performing an etching process to remove the capping layer and the dipole layer. In embodiments where the capping layer is not present, the method 100 comprises, at operation 110, removing the dipole layer to expose a surface of the treated high-κ dielectric layer. The etching process can be any suitable etching process known to the skilled artisan. In some embodiments, the etching process comprises a wet etch process or a dry etch process. In some embodiments, the etching process comprises a wet etch process.

Without intending to be bound by theory, when, at operation 108, the method 100 comprises annealing the substrate at a temperature of less than or equal to 1050° C. to drive atoms from the dipole layer into the high-κ dielectric layer, the high-κ dielectric layer comprises properties of the dipole layer. Stated differently, after performing an etching process to remove the capping layer and the dipole layer (where the capping layer is present) or removing the dipole layer (where the capping layer is not present), the treated high-κ dielectric layer has dipole properties as a result annealing the substrate (operation 108).

In one or more unillustrated embodiments, the method 100 includes treating the treated high-κ dielectric layer with the radical treatment again after removing the dipole layer at operation 110. In one or more specific embodiments, the treated high-κ dielectric layer is treated with the radical treatment again after removing the dipole layer at operation 110 prior to forming or depositing a gate metal or a gate contact on the treated high-κ dielectric layer at operation 112 of method 100. As used in this regard, "the treated high-κ dielectric layer" refers to a high-κ dielectric layer that has been treated with the radical treatment once and/or to a high-κ dielectric layer that has been treated with the radical treatment multiple times.

In some embodiments, the method 100 includes treating a surface of a metal gate stack with a radical treatment to form a treated high-κ dielectric layer (operation 102), depositing a dipole layer on the treated high-κ dielectric layer (operation 104), optionally depositing a capping layer on the dipole layer (operation 106), annealing the substrate (operation 108), optionally removing the dipole layer to expose a surface of the treated high-κ dielectric layer (operation 110), treating the treated high-κ dielectric layer with a subsequent radical treatment (not illustrated), and optionally forming a gate metal layer on the exposed surface of the treated high-κ dielectric layer, for example, the treated high-κ dielectric layer that has been treated with one radical treatment, or the treated high-κ dielectric layer that has been treated with one or more subsequent radical treatments (operation 112).

In one or more embodiments, the capping layer and the dipole layer are removed and a gate comprising one or more of a gate metal layer (not illustrated) or a gate contact (not illustrated) may optionally be formed or deposited on the exposed surface of the treated high-κ dielectric layer at operation 112 of method 100. The gate metal layer may be any suitable material known to one of skill in the art. In one or more embodiments, the gate metal layer comprises one or more of nitrogen (N), copper (Cu), cobalt (Co), tungsten (W), titanium (Ti), tantalum (Ta), molybdenum (Mo), nickel (Ni), ruthenium (Ru), iridium (Ir), aluminum (Al), or platinum (Pt). In one or more specific embodiments, the gate metal layer comprises a metal selected from one or more of cobalt (Co), tungsten (W), titanium (Ti), molybdenum (Mo), nickel (Ni), ruthenium (Ru), iridium (Ir), aluminum (Al), or platinum (Pt). In other specific embodiments, the gate metal layer comprises a metal or a metal alloy selected from one or more of cobalt (Co), tungsten (W), titanium (Ti), molybdenum (Mo), ruthenium (Ru), hafnium (Hf), or zirconium (Zr).

In embodiments where the gate metal is formed on the high-κ dielectric layer, the gate metal is deposited as a gate metal layer. The gate metal layer may be deposited using a deposition technique, such as, but not limited to, ALD, CVD, PVD, MBE, MOCVD, spin-on, or other insulating layer deposition techniques known to the skilled artisan. The gate metal layer may have any suitable thickness. In some embodiments, the gate metal layer has a thickness in a range of from 1 nm to 3 nm. In embodiments where the gate metal is formed on the treated high-κ dielectric layer, the gate metal layer has a capping layer thereon. In embodiments where the gate metal is formed on the treated high-κ dielectric layer and the gate metal layer has a capping layer thereon, the capping layer is formed by the same process described with respect to operation 106. The capping layer on the gate metal layer may have any suitable thickness. In some embodiments, the capping layer on the gate metal layer has a thickness in a range of from 0.5 nm to 2 nm, including in a range from 0.6 nm to 1.9 nm, in a range of from 0.7 nm to 1.8 nm, in a range of from 0.8 nm to 1.7 nm, in a range of from 0.9 nm to 1.6 nm, in a range of from 1 nm to 1.5 nm, in a range of from 1.1 nm to 1.4 nm, or in a range of from 1.2 nm to 1.3 nm.

In one or more embodiments, the gate contact may be any suitable material known to the skilled artisan. In one or more embodiments, the gate contact may be any suitable material having a resistivity less than or equal 1000 $\mu\Omega$-cm, including less than or equal to 900 $\mu\Omega$-cm, less than or equal to 800 $\mu\Omega$-cm, less than or equal to 700 $\mu\Omega$-cm, less than or equal to 600 $\mu\Omega$-cm, less than or equal to 500 $\mu\Omega$-cm, less than or equal to 400 $\mu\Omega$-cm, or less than or equal to 300 $\mu\Omega$-cm. In one or more embodiments, the gate contact comprises an element or an alloy selected from one or more of nitrogen (N), copper (Cu), cobalt (Co), tungsten (W), titanium (Ti), molybdenum (Mo), nickel (Ni), ruthenium (Ru), iridium (Ir), tantalum (Ta), aluminum (Al), or platinum (Pt).

Referring to FIG. 1B, the method 120 begins at operation 122 by treating a surface of a metal gate stack with a radical treatment. At operation 124, the method 120 optionally includes depositing a capping layer on a dipole layer of the metal gate stack. At operation 126, the method 120 comprises annealing the substrate. The radical treatment may be performed multiple times during method 120.

In FIG. 1B, the metal gate stack comprises a dipole layer on a high-κ dielectric layer on an interfacial layer on a top surface of a channel located between a source and a drain on a substrate. The dipole layer described with reference to FIG. 1B may have the same or similar properties as the dipole layer formed by operation 104 of method 100 shown in FIG. 1A.

At operation 122, the radical treatment comprises flowing one or more of nitrogen radicals ($N_2$*) and hydrogen radicals (H*) over the surface of the metal gate stack. In some embodiments, the radical treatment comprises flowing a mixture of nitrogen radicals ($N_2$*) and hydrogen radicals (H*) over the surface of the metal gate stack.

In some embodiments, the radical treatment is performed once after the dipole layer deposition cycles have been completed to form a dipole layer having a predetermined thickness. In some embodiments, the radical treatment is performed during dipole layer deposition cycles. In some embodiments, the radical treatment is performed multiple times during dipole layer deposition cycles. In some embodiments, the radical treatment is performed up to 5 times during dipole layer deposition cycles. For example, a thin dipole layer (e.g., a dipole layer having a thickness of 0.3 nm) is deposited and is followed by a radical treatment. In some embodiments, the method 120 comprises the following sequence: deposit a first thin dipole layer (e.g., a dipole layer having a thickness of 0.3 nm), perform a radical treatment, deposit a second thin dipole layer (e.g., a dipole layer having a thickness of 0.3 nm), perform a radical treatment, deposit a third thin dipole layer (e.g., a dipole layer having a thickness of 0.3 nm), perform a radical treatment, deposit a fourth thin dipole layer (e.g., a dipole layer having a thickness of 0.3 nm), perform a radical treatment, and deposit a fifth thin dipole layer (e.g., a dipole layer having a thickness of 0.3 nm), and perform a radical treatment.

In some embodiments, the radical treatment is performed after depositing the dipole layer to remove carbide, nitride, or oxide from the dipole layer. Without intending to be bound by theory, it is thought that the radical treatment reduces an amount of impurities, such as chlorine ($Cl_2$) and/or carbon (C), in the dipole layer of the electronic device compared to methods of manufacturing an electronic device that do not include a radical treatment. In some embodiments, the radical treatment advantageously results in a percentage increase of the amount of metal atoms in the dipole layer. Stated different, in some embodiments, the amount of non-metal atoms in the dipole layer decreases as a result of the radical treatment such that there is a percentage increase of the amount of metal atoms in the dipole layer. Without intending to be bound by theory, having an increased amount of metal atoms in the dipole layer is beneficial for diffusion of metal atoms through the high-κ dielectric layer.

At operation 124, the method 120 optionally includes depositing a capping layer on a dipole layer of the metal gate stack. Depositing the capping layer on the dipole layer of the metal gate stack at operation 124 may include the same process or a similar process as described with respect to operation 106 of method 100. At operation 126, the method 120 comprises annealing the substrate. Annealing the substrate at operation 126 may include the same process or a similar process as described with respect to operation 108 of method 100.

Referring to FIG. 1C, the method 130 begins at operation 132 by treating a surface of a metal gate stack with a radical treatment. At operation 134, the method 130 optionally includes depositing a capping layer on a gate metal layer of the metal gate stack. At operation 136, the method 130 comprises annealing the substrate. Annealing the substrate at operation 136 does not include the same process or a similar process as described with respect to operation 108 of method 100 and/or operation 126 of method 120. The radical treatment may be performed multiple times during method 130.

In FIG. 1C, the metal gate stack comprises a gate metal layer on a high-κ dielectric layer on an interfacial layer on a top surface of a channel located between a source and a drain on a substrate. The gate metal layer described with reference to FIG. 1C may have the same or similar properties as the gate metal layer optionally formed by operation 112 of method 100 shown in FIG. 1A.

At operation 132, the radical treatment comprises flowing one or more of nitrogen radicals ($N_2$*) and hydrogen radicals (H*) over the surface of the metal gate stack. In some embodiments, the radical treatment comprises flowing a mixture of nitrogen radicals ($N_2$*) and hydrogen radicals (H*) over the surface of the metal gate stack.

The radical treatment described herein changes the composition of the metal gate layer, thereby changing the work function (WF) of the metal layer. It is thought that changing the WF can be used to achieve target $V_t$ values for the electronic device.

In one or more embodiments, it has been advantageously found that the radical treatment reduces an amount of carbon atoms when the gate metal layer comprises an n-type gate metal layer compared to methods of manufacturing an electronic device that do not include a radical treatment.

In one or more embodiments, it has also been found that the radical treatment advantageously increases an amount of oxygen atoms when the gate metal layer comprises a p-type metal compared to methods of manufacturing an electronic device that do not include a radical treatment.

Depositing the capping layer on the gate metal layer of the metal gate stack at operation 134 may include the same process or a similar process as described with respect to operation 106 of method 100. At operation 136, the method 130 comprises annealing the substrate. Annealing the substrate at operation 136 does not include the same process or a similar process as described with respect to operation 108 of method 100 and/or operation 126 of method 120. In some embodiments, operation 108 of method and/or operation 126 of method 120 include annealing the substrate at a temperature of less than or equal to 1050° C. to drive atoms from the dipole layer into the treated high-κ dielectric layer. At operation 136, the method 130 comprises annealing the substrate at a temperature of less than or equal to 550° C., including less than or equal to 500° C., less than or equal to 450° C., or less than or equal to 400° C.

Conventionally, in metal gate stacks where the capping layer comprises titanium nitride (TiN), the titanium nitride (TiN) thickness increases with age time due to oxidation. Without intending to be bound by theory, as a result of the radical treatment, the titanium nitride (TiN) thickness advantageously remains consistent, providing an indication that radical treatment can improve oxidation resistance.

Figure 3A:
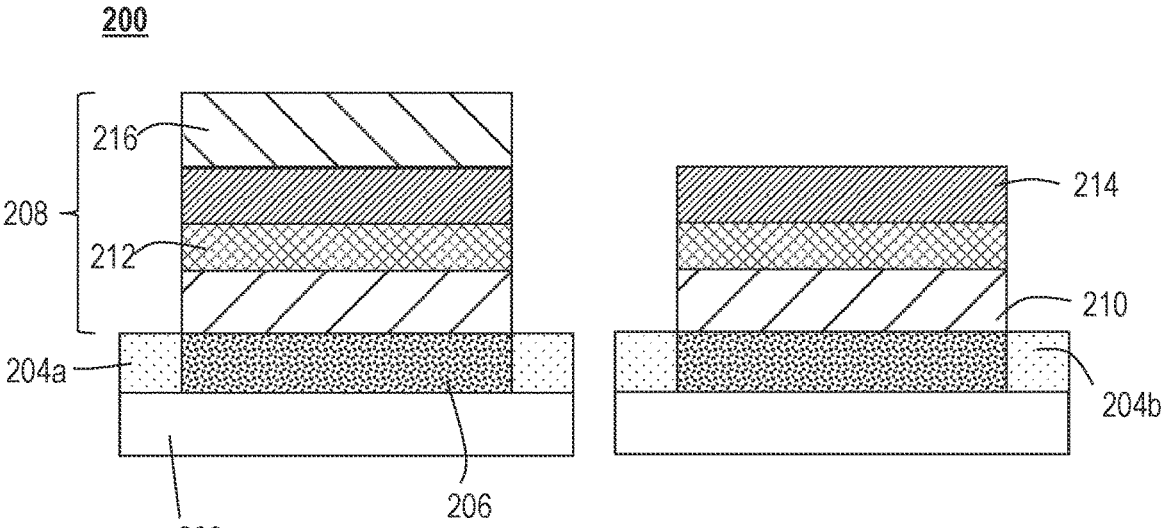
FIG. 3A illustrates a cross-sectional view of a substrate according to one or more embodiments.
Figure 3B:
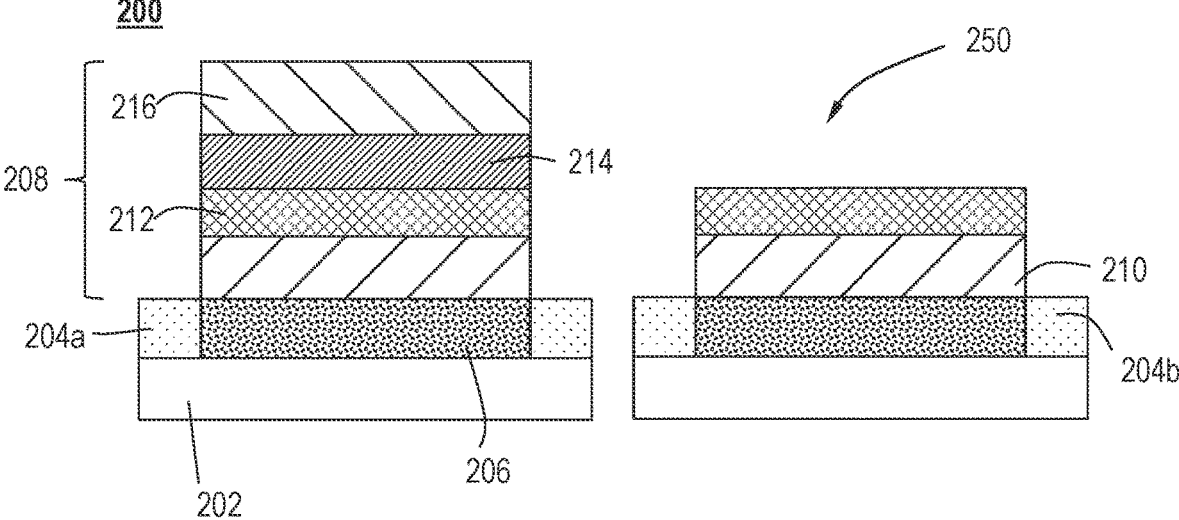
FIG. 3B illustrates a cross-sectional view of a substrate according to one or more embodiments.

FIGS. 2, 3A, and 3B are cross-section views of an electronic device (e.g., a transistor) 200 according to one or more embodiments. The electronic devices 200 shown in FIGS. 2, 3A, and 3B may be manufactured by the methods 100, 120, and 130 illustrated in FIGS. 1A-1C.

In one or more embodiments, the electronic device 200 comprises a semiconductor substrate 202 having a top surface 203. The semiconductor substrate 202 can be any suitable substrate material. In one or more embodiments, the semiconductor substrate 202 comprises a semiconductor material, e.g., silicon (Si), carbon (C), germanium (Ge), silicon germanium (SiGe), gallium arsenide (GaAs), indium phosphate (InP), indium gallium arsenide (InGaAs), indium aluminum arsenide (InAlAs), germanium (Ge), silicon germanium (SiGe), copper indium gallium selenide (CIGS), other semiconductor materials, or any combination thereof. In one or more embodiments, the semiconductor substrate 202 comprises one or more of silicon (Si), germanium (Ge), gallium (Ga), arsenic (As), indium (In), phosphorus (P), copper (Cu), or selenium (Se). Although a few examples of materials from which the semiconductor substrate 202 may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In one or more embodiments, the semiconductor substrate 202 is a p-type or n-type substrate. As used herein, the term "n-type" refers to semiconductors that are created by doping an intrinsic semiconductor with an electron donor element during manufacture. The term n-type comes from the negative charge of the electron. In n-type semiconductors, electrons are the majority carriers and holes are the minority carriers. As used herein, the term "p-type" refers to the positive charge of a well (or hole). As opposed to n-type semiconductors, p-type semiconductors have a larger hole concentration than electron concentration. In p-type semiconductors, holes are the majority carriers and electrons are the minority carriers.

In some embodiments, a source region 204a is on the top surface 203 of the semiconductor substrate 202. In one or more embodiments, the source region 204a has a source and a source contact (not illustrated). A drain region 204b is on the top surface 203 of the semiconductor substrate 202 opposite the source region 204a. In one or more embodiments, the drain region 204b has a drain and a drain contact (not illustrated).

In one or more embodiments, the source region 204a and/or the drain region 204b can be any suitable material known to the skilled artisan. In one or more embodiments, the source region 204a and/or the drain region 204b may have more than one layer. For example, the source region 204a and/or the drain region 204b may independently comprise three layers. In one or more embodiments, the source region 204a and the drain region 204b may independently comprise one or more of copper (Cu), cobalt (Co), tungsten (W), titanium (Ti), molybdenum (Mo), nickel (Ni), ruthenium (Ru), silver (Ag), gold (Au), iridium (Ir), platinum (Pt), phosphorus (P), germanium (Ge), silicon (Si), aluminum (Al), or zirconium (Zr). In some embodiments, the source region 204a and the drain region 204b may independently comprise a bottom layer of silicon with doped epi (e.g., SiGe, SiP, and the like), a second layer of silicide, which may contain nickel (Ni), titanium (Ti), aluminum (Al), and the like, and a third, or top, layer which may be a metal such as, but not limited to, cobalt, tungsten, ruthenium, and the like.

In some embodiments, the source region 204a and the drain region 204b may be raised source/drain regions formed by epitaxial growth. In one or more embodiments, the source contact and/or the drain contact may independently be selected from one or more of nitrogen (N), copper (Cu), cobalt (Co), tungsten (W), titanium (Ti), molybdenum (Mo), nickel (Ni), ruthenium (Ru), silver (Ag), gold (Au), iridium (Ir), tantalum (Ta), or platinum (Pt). In one or more embodiments, formation of the source contact and/or the drain contact is conducted by any suitable process known to the skilled artisan, including, but not limited to ALD, CVD, PVD, MBE, MOCVD, spin-on, or other insulating layer deposition techniques known to the skilled artisan.

In one or more embodiments, a channel 206 is located between the source region 204a and the drain region 204b. In one or more embodiments, a dipole region 208 overlies the channel 206 and is in contact with one or more of the channel 206, the source region 204a, and the drain region 204b. In one or more embodiments, the dipole region 208 has a thickness in a range of from 2 nm to 6 nm, including in a range of from 2.5 nm to 5.5 nm, in a range of from 3 nm to 5 nm, or in a range of from 3.5 nm to 4.5 nm.

In one or more embodiments, the dipole region 208 comprises one or more of an interfacial layer 210, a high-κ dielectric layer 212, a dipole layer 214, and a capping layer 216. In some embodiments, the dipole region 208 comprises an interfacial layer 210, a high-κ dielectric layer 212, a dipole layer 214 and a capping layer 216. In some embodiments, the dipole region 208 comprises an interfacial layer 210, a high-κ dielectric layer 212, and a dipole layer 214.

In one or more embodiments, the interfacial layer 210 is deposited on a top surface 205 of a channel 206. In some embodiments, the interfacial layer 210 is deposited on the top surface 205 of the channel 206 according to operation 102 of method 100. In some embodiments, the 210 interfacial layer comprises a dielectric material selected from one or more of silicon (Si), silicon oxide (SiOx), doped silicon, doped silicon oxide, or spin-on dielectrics.

The interfacial layer 210 may have any suitable thickness. In some embodiments, the interfacial layer 210 has a thickness in a range of from 0.2 nm to 0.8 nm, including in a range of from 0.3 nm to 0.7 nm, or in a range of from 0.4 nm to 0.6 nm.

In one or more embodiments, a high-κ dielectric layer 212 is deposited on a top surface 211 of the interfacial layer 210. In some embodiments, the high-κ dielectric layer 212 is deposited on a top surface 211 of the interfacial layer 210 according to operation 104 of method 100. The high-κ dielectric layer 212 can be any suitable high-κ dielectric material known to the skilled artisan. In one or more embodiments, the high-κ dielectric layer 212 comprises one or more of hafnium oxide (HfOx), zirconium oxide (ZrOx), hafnium zirconium oxide (HfZrOx), or a spin-on dielectric.

The high-κ dielectric layer 212 may have any suitable thickness. In some embodiments, the high-κ dielectric layer 212 has a thickness in a range of from 1 nm to 2 nm, including in a range of from 1.1 nm to 1.9 nm, in a range of from 1.2 nm to 1.8 nm, in a range of 1.3 nm to 1.7 nm, or in a range of from 1.4 nm to 1.6 nm.

In one or more embodiments, a dipole layer 214 is deposited on a top surface 213 of the high-κ dielectric layer 212. In some embodiments, the dipole layer 214 is deposited on the top surface 213 of the high-κ dielectric layer 212 according to operation 106 of method 100. The dipole layer 214 may have any suitable thickness. In some embodiments, the dipole layer 214 has a thickness in a range of from 0.3 nm to 1.5 nm, including in a range of from 0.4 nm to 1.4 nm, in a range of from 0.5 nm to 1.3 nm, in a range of form 0.6 nm to 1.2 nm, in a range of from 0.7 nm to 1.1 nm, or in a range of from 0.8 nm to 1.0 nm.

In one or more specific embodiments, when the dipole layer 214 comprises one or more of a metal carbide, a metal nitride, or a metal oxide, the method 100 and/or the method 120 further comprises performing a radical treatment to remove carbide, nitride and oxide from each of the metal carbide, the metal nitride, or the metal oxide. The radical treatment process may include any process of removing carbide, nitride and oxide known by the skilled artisan. In one or more embodiments, the radical treatment includes introduction of radicals comprising one or more of H*, OH*, O*, $N_2$*, $NH_3$* or $H_2O$*. In some embodiments, the radicals are generated by forming a plasma from a radical gas. In some embodiments, the plasma is generated by a remote plasma source.

In one or more embodiments, a capping layer 216 is optionally deposited to control film oxidation after deposition of the dipole layer 214. Stated differently, in some embodiments, the composition of the dipole layer 214 does not change when depositing the capping layer 216 and treating the capping layer 216 with the radical treatment described herein. In one or more embodiments, the capping layer 216 is optionally deposited on a top surface 215 of the dipole layer 214 according to operation 108 of method 100. In one or more embodiments, the electronic device 200 does not include the capping layer 216.

In one or more embodiments where the electronic device 200 includes the capping layer 216, the capping layer 216 is an in situ capping layer. In some embodiments, the capping layer 216 comprises one or more of amorphous silicon, a metal, a metal carbide, a metal nitride, or a metal oxide. The capping layer 216 may have any suitable thickness. In some embodiments, the capping layer has a thickness in a range of from 0.5 nm to 2 nm, including in a range from 0.6 nm to 1.9 nm, in a range of from 0.7 nm to 1.8 nm, in a range of from 0.8 nm to 1.7 nm, in a range of from 0.9 nm to 1.6 nm, in a range of from 1 nm to 1.5 nm, in a range of from 1.1 nm to 1.4 nm, or in a range of from 1.2 nm to 1.3 nm.

Referring to FIG. 3A, in one or more embodiments, the capping layer 216 on the PFET side 250 is removed by patterning. Referring to FIG. 3B, in one or more embodiments, the dipole layer 214 and the capping layer 216 on the PFET side 250 are removed by patterning. At operation 112, the method 100 optionally includes forming a gate metal layer on the exposed surface of the treated high-κ dielectric layer.

In one or more unillustrated embodiments, the method comprises depositing a capping layer on the gate metal layer to control film oxidation. In some embodiments, the capping layer has the same or similar properties as capping layer 216. In some embodiments, the method comprises treating the capping layer on the gate metal layer with the radical treatment. Stated differently, in some embodiments, the composition of the gate metal layer does not change when depositing the capping layer (e.g., capping layer 216) and treating the capping layer 216 with the radical treatment described herein.

Figure 4:
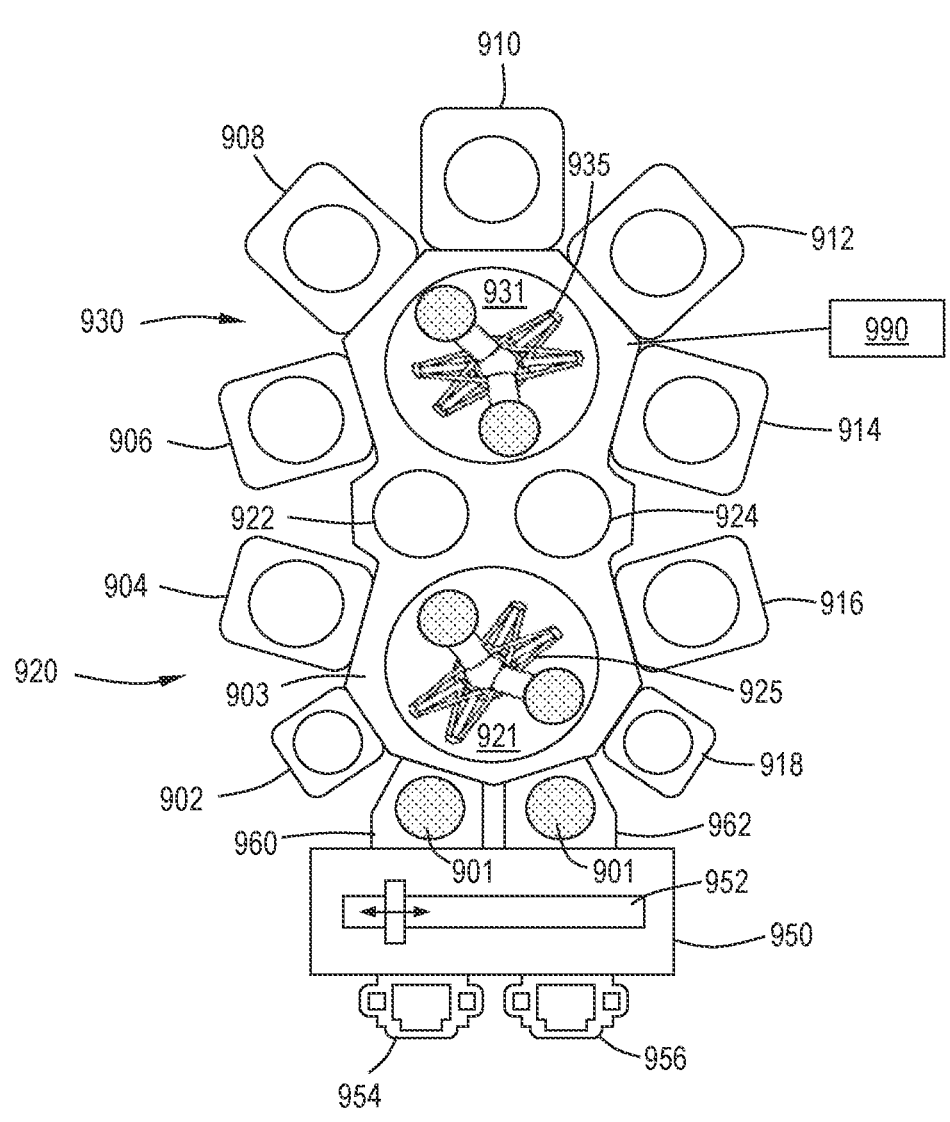
FIG. 4 illustrates a cluster tool according to one or more embodiments of the disclosure.

Additional embodiments of the disclosure are directed to a cluster tool 900 for the formation of the electronic devices and performing the methods 100, 120, and 130 described, as shown in FIG. 4.

The cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, a preclean chamber, a buffer chamber, transfer space(s), a wafer orienter/degas chamber, a cryo cooling chamber, a deposition chamber, annealing chamber, etching chamber, a thermal processing (RTP) chamber, a plasma oxidation chamber, a plasma nitridation chamber, and an atomic layer deposition (ALD) chamber. The particular arrangement of process chambers and components can be varied depending on the cluster tool and should not be taken as limiting the scope of the disclosure.

In the embodiment shown in FIG. 4, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In one or more embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930 or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit, memory, suitable circuits and storage.

Processes may generally be stored in the memory of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In one or more embodiments, the cluster tool 900 comprises a central transfer station 921, 931 comprising at least one robot 925, 935 configured to perform method 100, method 120, and/or method 130. In some embodiments, the at least one robot 925, 935 is configured to perform the radical treatment once or multiple times during method 100, method 120, and/or method 130.

One or more embodiments of the disclosure are directed to a non-transitory computer readable medium including instructions, that, when executed by a controller of a processing chamber, cause the processing chamber to perform the operations of method 100, method 120, and/or method 130. In one or more embodiments the controller of the processing chamber causes the processing chamber to perform the radical treatment once or multiple times during performing the operations of method 100, method 120, and/or method 130.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of manufacturing an electronic device, the method comprising:

treating a surface of a metal gate stack with a radical treatment, the metal gate stack comprising a high-κ dielectric layer on an interfacial layer on a top surface of a channel located between a source and a drain on a substrate, wherein the radical treatment comprises flowing a mixture of about 50% nitrogen radicals ($N_2*$) and about 50% hydrogen radicals ($H*$) over the surface of the metal gate stack to form a treated high-κ dielectric layer, and wherein the radical treatment increases an amount of nitrogen ($N_2$) atoms present in the treated high-κ dielectric layer by at least 50% compared to the amount of nitrogen ($N_2$) atoms present in an untreated high-κ dielectric layer;

depositing a dipole layer on the treated high-κ dielectric layer; and annealing the substrate at a temperature of less than or equal to 1050° C. to drive atoms from the dipole layer into the treated high-κ dielectric layer.

2. The method of claim 1, wherein the interfacial layer comprises a dielectric material selected from one or more of silicon (Si), silicon oxide (SiOx), doped silicon, doped silicon oxide, or spin-on dielectrics.

3. The method of claim 1, wherein the high-κ dielectric layer comprises one or more of hafnium oxide (HfOx), zirconium oxide (ZrOx), or hafnium zirconium oxide (HfZrOx).

4. The method of claim 1, wherein the radical treatment reduces a thickness of the dipole layer deposited on the treated high-κ dielectric layer compared to methods of manufacturing an electronic device that do not include a radical treatment.

5. The method of claim 1, wherein the radical treatment reduces equivalent oxide thickness (EOT) in the electronic device compared to methods of manufacturing an electronic device that do not include a radical treatment.

6. The method of claim 1, wherein the dipole layer comprises one or more of titanium aluminum nitride (TiAlN) or lanthanum nitride (LaN).

7. The method of claim 1, further comprising depositing a capping layer on the dipole layer.

8. The method of claim 7, wherein the capping layer comprises one or more of amorphous silicon, a metal, a metal carbide, a metal nitride, or a metal oxide.

9. The method of claim 1, further comprising removing the dipole layer to form an exposed surface of the high-κ dielectric layer.

10. The method of claim 9, further comprising forming a gate metal layer on the exposed surface of the high-κ dielectric layer.

11. A method of manufacturing an electronic device, the method comprising:

treating a surface of a metal gate stack with a radical treatment, the metal gate stack comprising a dipole layer on a high-κ dielectric layer on an interfacial layer on a top surface of a channel located between a source and a drain on a substrate, wherein the radical treatment comprises flowing a mixture of about 50% nitrogen radicals ($N_2*$) and about 50% hydrogen radicals ($H*$) over the surface of the metal gate stack, and wherein the radical treatment increases an amount of nitrogen ($N_2$) atoms present in the high-κ dielectric layer by at least 50% compared to the amount of nitrogen ($N_2$) atoms present in an untreated high-κ dielectric layer; and annealing the substrate at a temperature of less than or equal to 1050° C. to drive atoms from the dipole layer into the high-κ dielectric layer.

12. The method of claim 11, wherein the radical treatment is performed while depositing the dipole layer.

13. The method of claim 11, wherein the radical treatment is performed after depositing the dipole layer to remove carbide, nitride, or oxide from the dipole layer.

14. The method of claim 11, wherein the radical treatment reduces an amount of impurities in the dipole layer of the electronic device compared to methods of manufacturing an electronic device that do not include a radical treatment.

15. The method of claim 11, wherein the metal gate stack further comprises a capping layer on the dipole layer and the radical treatment controls oxidation of the dipole layer.

16. The method of claim 15, wherein the capping layer comprises one or more of amorphous silicon, a metal, a metal carbide, a metal nitride, or a metal oxide.

17. A method of manufacturing an electronic device, the method comprising:

treating a surface of a metal gate stack with a radical treatment, the metal gate stack comprising a gate metal layer on a high-κ dielectric layer on an interfacial layer on a top surface of a channel located between a source and a drain on a substrate, wherein the radical treatment comprises flowing a mixture of about 50% nitrogen radicals ($N_2*$) and about 50% hydrogen radicals ($H*$) over the surface of the metal gate stack, and wherein the radical treatment increases an amount of nitrogen ($N_2$) atoms present in the high-κ dielectric layer by at least 50% compared to the amount of nitrogen ($N_2$) atoms present in an untreated high-κ dielectric layer.

18. The method of claim 17, wherein the radical treatment reduces an amount of carbon atoms when the gate metal layer comprises an n-type metal compared to methods of manufacturing an electronic device that do not include a radical treatment.

19. The method of claim 17, wherein the radical treatment increases an amount of oxygen atoms when the gate metal layer comprises a p-type metal compared to methods of manufacturing an electronic device that do not include a radical treatment.

20. The method of claim 17, wherein the metal gate stack further comprises a capping layer on the gate metal layer and treating the capping layer with the radical treatment controls oxidation of the gate metal layer.

* * * * *